United States Patent
Park et al.

(10) Patent No.: US 7,091,567 B2
(45) Date of Patent: Aug. 15, 2006

(54) SEMICONDUCTOR DEVICE INCLUDING AIR GAP BETWEEN SEMICONDUCTOR SUBSTRATE AND L-SHAPED SPACER AND METHOD OF FABRICATING THE SAME

(75) Inventors: Ho-Woo Park, Hwaseong-gun (KR); Hyung-Moo Park, Yongin-si (KR)

(73) Assignee: Samsung Electronics Co., Ltd.., Suwon-si (KR)

( * ) Notice: Subject to any disclaimer, the term of this patent is extended or adjusted under 35 U.S.C. 154(b) by 0 days.

(21) Appl. No.: 10/807,437

(22) Filed: Mar. 24, 2004

(65) Prior Publication Data

US 2005/0037585 A1  Feb. 17, 2005

(30) Foreign Application Priority Data

Aug. 12, 2003  (KR) ............... 10-2003-0055897

(51) Int. Cl.
*H01L 29/78* (2006.01)

(52) U.S. Cl. ............... 257/408; 257/E21.626; 257/E29.266; 257/900

(58) Field of Classification Search ............... 257/408, 257/900, E21.626, E29.266; 438/230, 303, 438/595
See application file for complete search history.

(56) References Cited

U.S. PATENT DOCUMENTS

| 6,087,234 A |  | 7/2000 | Wu .............................. 438/299 |
| 6,359,321 B1 | * | 3/2002 | Shimizu et al. ............. 257/412 |
| 6,924,180 B1 | * | 8/2005 | Quek ........................ 438/163 |
| 2002/0045318 A1 | * | 4/2002 | Chen et al. .................. 438/303 |
| 2003/0045061 A1 | * | 3/2003 | Kwon et al. ................. 438/303 |
| 2004/0063289 A1 | * | 4/2004 | Ohta ........................... 438/303 |
| 2004/0155269 A1 | * | 8/2004 | Yelehanka et al. .......... 257/288 |
| 2004/0157457 A1 | * | 8/2004 | Xu et al. ..................... 438/694 |
| 2005/0116360 A1 | * | 6/2005 | Huang et al. ................ 257/900 |

* cited by examiner

*Primary Examiner*—Mary Wilczewski
*Assistant Examiner*—Toniae M. Thomas
(74) *Attorney, Agent, or Firm*—Volentine Francos & Whitt, PLLC

(57) ABSTRACT

A semiconductor device includes source/drain regions, a gate pattern disposed on the semiconductor substrate between the source/drain regions, and L-shaped spacers that are used as masks in the forming of the source/drain regions. The L-shaped spacers each include a vertical portion covering a side wall of the gate pattern, and a lateral portion extending from the bottom of the vertical portion over the source/drain region. Support portions interposed between the L-shaped spacers and the gate pattern support the lateral portions of the L-shaped spacers such that an air gap is defined between at least the lateral portions of the L-shaped spacers and the source/drain regions. The air gap minimizes the parasitic capacitance associated with the gate electrode of the semiconductor device.

10 Claims, 4 Drawing Sheets

SEMICONDUCTOR DEVICE INCLUDING AIR GAP BETWEEN SEMICONDUCTOR SUBSTRATE AND L-SHAPED SPACER AND METHOD OF FABRICATING THE SAME

BACKGROUND OF THE INVENTION

1. Field of the Invention

The present invention relates to the field of semiconductor device fabrication. More particularly, the present invention relates to a semiconductor device comprising a gate electrode and source/drain regions, and to a method of fabricating the same.

2. Description of the Related Art

One important element of a semiconductor device is a field effect transistor (FET). The size of these field effect transistors (FETs) is decreasing at a rapid rate as the design rule of semiconductor devices becomes increasingly smaller. In addition, reducing the power consumption and increasing the operating speed of semiconductor devices are also regarded as important aims of the manufacturing process.

One problem that has been associated with manufacturing a FET on a reduced scale is that a hot carrier is injected into a gate insulating layer of the FET. However, the introduction of a lightly-doped drain (LDD) structure in the FET has overcome such a problem. One technique for fabricating an LDD structure entails forming L-shaped spacers on the both side walls of a gate electrode, and then forming a lightly-doped source/drain region by implanting ions into the substrate using the gate electrode and the L-shaped spacers as ion implantation masks.

FIG. 1 is a sectional view of a conventional semiconductor device having an L-shaped spacer disposed on the sidewall of a gate electrode, as disclosed in U.S. Pat. No. 6,087,234 entitled "Method of forming a self-aligned silicide MOSFET with an extended ultra-shallow S/D junction" and issued to Shye-Lin Wu. As shown in FIG. 1, the conventional semiconductor device includes L-shaped spacers 13 covering the side walls of a gate electrode 12 and portions of a semiconductor substrate 10 adjacent the gate electrode 12. In FIG. 1, reference numeral "11" designates a gate insulating layer, reference numeral "14" designates a lightly-doped source/drain region, and reference numeral "15" designates a highly-doped source/drain region.

Now, various aspects of such a semiconductor device should be taken into consideration when attempting to improve the operation speed of the semiconductor device. An important one of these aspects is the matter of parasitic capacitance that exists in many portions of the semiconductor device. Parasitic capacitance gives rise to a delay in the operation of the device and hence, limits the operation speed that can be achieved by the device. One such source of parasitic capacitance exists at the gate electrode, and will be referred to as gate fringe parasitic capacitance. FIG. 1 shows the gate fringe parasitic capacitance ($C_{gf}$) of the conventional semiconductor device, which results from the L-shaped spacers 13 being interposed between and in contact with the gate electrode 12 and the lightly-doped source/drain regions 14.

SUMMARY OF THE INVENTION

An object of the present invention is to provide a semiconductor device having a rapid operating speed.

A more specific object of the present invention is to provide a semiconductor device having minimal parasitic capacitance associated with the gate electrode of the device.

To meet these objects, the present invention provides a semiconductor device and a method of manufacturing the same wherein an air gap exists between the substrate of the device and an L-shaped spacer that covers a side wall of the gate electrode of the device.

According to one aspect of the present invention, a semiconductor device includes source/drain regions, a gate pattern disposed on the semiconductor substrate between the source/drain regions, and L-shaped spacers that are used as masks in the forming of the source/drain regions. The L-shaped spacers each include a vertical portion covering a side wall of the gate pattern, and a lateral portion extending laterally from the bottom of the vertical portion over the source/drain region. Support portions interposed between the L-shaped spacers and the gate pattern support the lateral portions of the L-shaped spacers such that an air gap is defined between at least the lateral portions of the L-shaped spacers and the source/drain regions.

According to another aspect of the present invention, a method of fabricating a semiconductor device begins by forming a gate pattern on a semiconductor substrate. A support layer, a spacer insulating layer and a sacrificial layer are then sequentially formed on the semiconductor substrate including over the gate pattern. The sacrificial layer, the spacer insulating layer, and the support layer are anisotropically etched so as to form L-shaped support patterns covering the side walls of the gate pattern and respective portions of the semiconductor substrate adjacent to the gate pattern, L-shaped spacers covering the L-shaped support patterns, and sacrificial patterns covering the L-shaped spacers. The L-shaped support pattern is isotropically etched so as to form air gaps between lateral portions of the L-shaped spacers and the semiconductor substrate. Impurity ions are then implanted into the semiconductor substrate so as to form source/drain regions adjacent the gate pattern.

According to another aspect of the present invention, a buffer insulating layer is formed on the semiconductor substrate including over the gate pattern. The buffer insulating layer is of a material having an etch selectivity with respect to the gate pattern. In this case, the support layer and the sacrificial layer are formed of the same material, and one having etching selectivity to the spacer insulating layer. Again, the sacrificial layer, the spacer insulating layer, and the support layer are anisotropically etched so as to form L-shaped support patterns covering the side walls of the gate pattern and respective portions of the semiconductor substrate adjacent to the gate pattern, L-shaped spacers covering the L-shaped support patterns, and sacrificial patterns covering the L-shaped spacers. Then, the sacrificial pattern is removed, and the L-shaped support patterns are isotropically etched to provide the air gaps between the lateral portions of the L-shaped spacers and the semiconductor substrate. Finally, the ion implantation process is performed to form the source/drain regions.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings, in which.

DETAILED DESCRIPTION OF THE PREFERRED EMBODIMENTS

Figure 1:
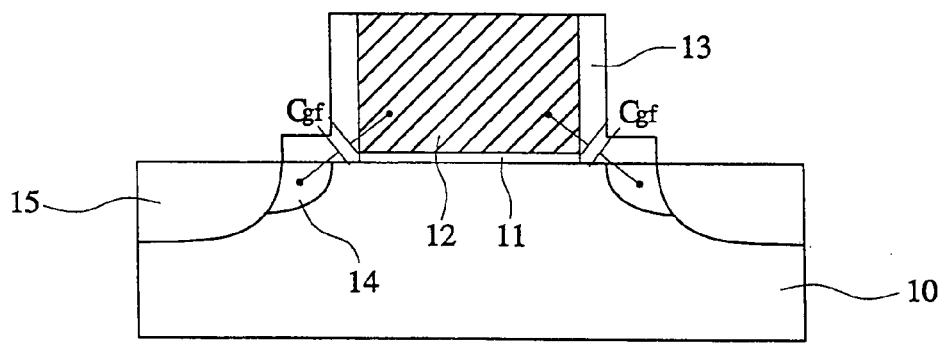
FIG. 1 is a sectional view of a semiconductor device having an L-shaped spacer according to the prior art.

The present invention will now be described more fully hereinafter with reference to the accompanying drawings. In the drawings, the thickness of layers and regions are exaggerated for clarity. Also, like numbers designate like elements throughout the drawings.

Figure 2:
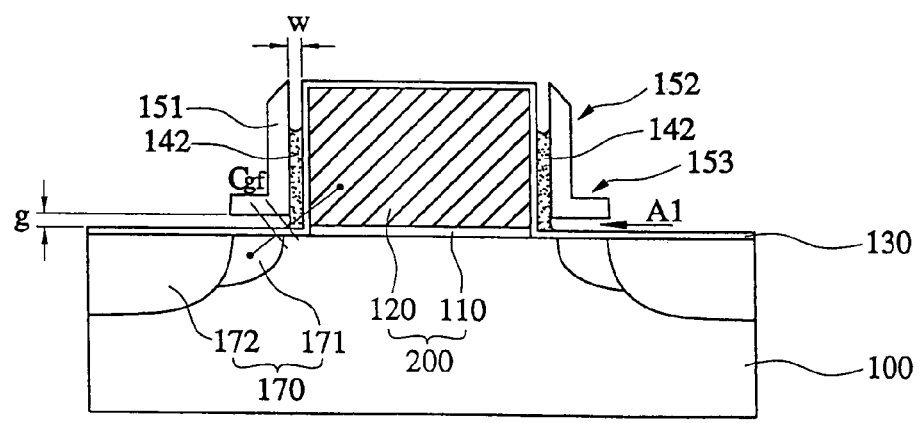
FIG. 2 is a sectional view of a semiconductor device according to the present invention.

As shown in FIG. 2, the semiconductor device according to the present invention includes a semiconductor substrate 100, a gate pattern 200 comprising a gate insulating layer 110 and a gate electrode 120 formed on the semiconductor substrate 100, and L-shaped spacers 151 covering both side walls of the gate pattern 200, respectively, and portions of the semiconductor substrate adjacent to the gate pattern 200. The L-shaped spacer 151 includes a vertical portion 152 spaced from the side wall of the gate pattern 200, and a lateral portion 153 extending from the bottom of the vertical portion parallel to the semiconductor substrate 100. Furthermore, an air-gap A1 is provided under the lateral portion 153, i.e., between the semiconductor substrate 100 and the lateral portion 153 of the L-shaped spacer 151. Still further, the semiconductor device of the present invention includes support portions 142 located between the side walls of the gate pattern 200 and the L-shaped spacers 151, for supporting the L-shaped spacers 151. Also, source/drain regions 170 are formed in the semiconductor substrate 100 adjacent to the gate pattern 200. Each source/drain region 170 includes a lightly-doped source/drain region 171 covered by the lateral portion 153 of an L-shaped spacer 151, and a highly-doped source/drain region 172 contacting the lightly-doped source/drain region 171.

The L-shaped spacer 151 may be formed of an oxide layer. The support portions 142 may be formed of a semi-insulating polysilicon or nitride layer. Furthermore, a buffer insulating layer 130 may be formed between the gate electrode 120 and the support portions 142, if the materials of the gate electrode 120 and the support portions 142 warrant such a buffer layer.

The air gap A1 between the lateral portion 153 of the L-shaped spacer 151 and the semiconductor substrate 100 provides an advantage of reducing fringe parasitic capacitance ($C_{gf}$) at the gate electrode 120. More specifically, the gate electrode 120 and the lightly-doped source/drain region 171 function as electrodes of a parasitic capacitor. Accordingly, the parasitic capacitance ($C_{gf}$) at the gate electrode 120 is reduced by providing the air gap A1 between the gate electrode 120 and the lightly-doped source/drain region 171 and, more specifically, by increasing the interval between the gate electrode 120 and the lightly-doped source/drain region 171 by an amount corresponding to the width 'g' of the air gap A1 and the width 'w' of the support portion 142.

A method of fabricating a semiconductor device according to the present invention will now be described with reference to FIGS. 3A to 3E.

Figure 3A:
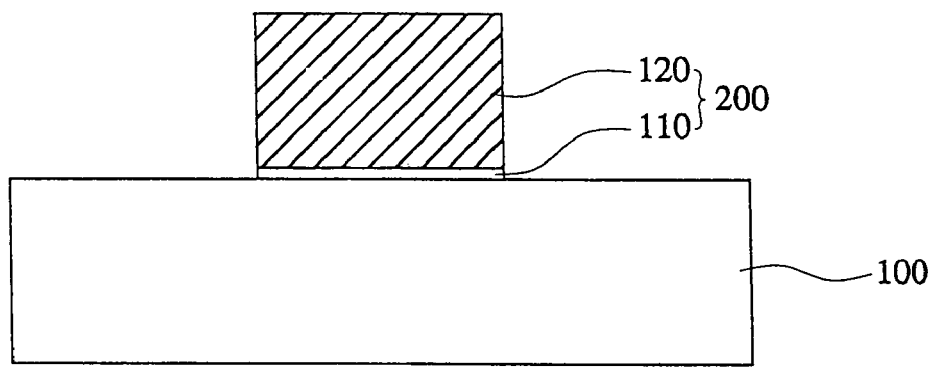
FIGS. 3A to 3E are sectional views of a substrate, illustrating a method of fabricating a semiconductor device according to the present invention.

First, as shown in FIG. 3A, a gate insulating layer 110 is formed on a semiconductor substrate 100 such as a silicon substrate. The gate insulating layer 110 is formed of $SiO_2$, $Si_3N_4$, SiON, $ZrO_2$, $HfO_2$, $Ta_2O_5$ or $Al_2O_3$. Then, a conductive layer is formed on the gate insulating layer 110, and the insulating layer 110 and the conductive layer are patterned. The patterning of the conductive layer forms a gate electrode 120 on the gate insulating layer 110. The gate insulating layer 110 and the gate electrode 120 together constitute a gate pattern 200.

Figure 3B:
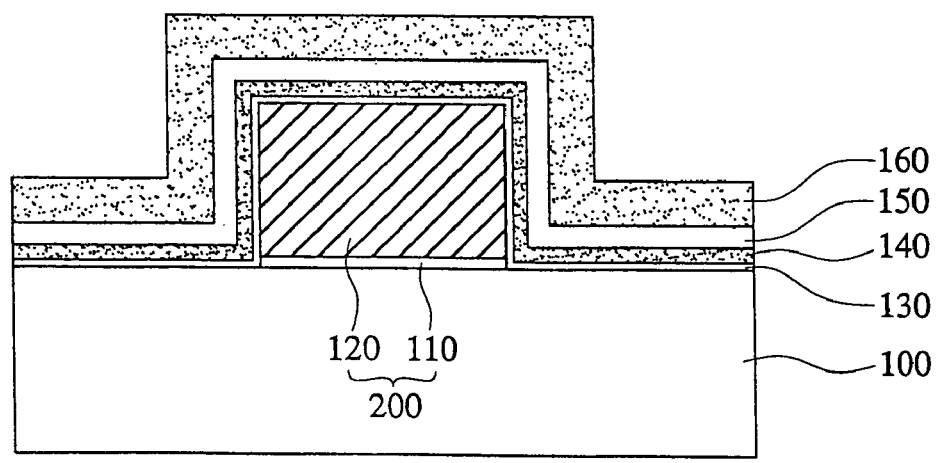

Then, as shown in FIG. 3B, a buffer insulating layer 130 is formed on the semiconductor substrate 100. One of the reasons for forming the buffer insulating layer 130 is to compensate for etching damage caused during the forming of the gate pattern 200. The buffer insulating layer 130 can be formed by growing an oxide on the structure to a thickness of 90 Å to 110 Å.

Then, a support layer 140, a spacer insulating layer 150 and a sacrificial layer 160 are sequentially formed on the buffer insulating layer 130. The buffer insulating layer 130, the support layer 140, the spacer insulating layer 150, and the sacrificial layer 160 are formed to conform to the topography of the semiconductor substrate 100 and gate pattern 200.

In the embodiment of the present invention, the spacer insulating layer 150 is an oxide layer formed to a thickness of 100 Å to 500 Å using a chemical vapor deposition (CVD) process. The support layer 140 and the sacrificial layer 160 are each a polysilicon layer or nitride layer formed to a thickness of 100 Å to 1000 Å using a chemical vapor deposition process, the polysilicon or nitride layer having an etching selectivity with respect to the oxide of the spacer insulating layer 150. In the case of forming the support layer 140 as a polysilicon layer, a semi-insulating polysilicon is preferably used to prevent the generation of parasitic capacitance. Furthermore, the support layer 140 and the sacrificial layer 160 are preferably formed of the same material in order to simplify the process. In the case of forming both the gate electrode 120 and the support layer 140 of polysilicon, the buffer insulating layer 130 can function to prevent the etching of the gate electrode 120 during a subsequent etching process.

Figure 3C:
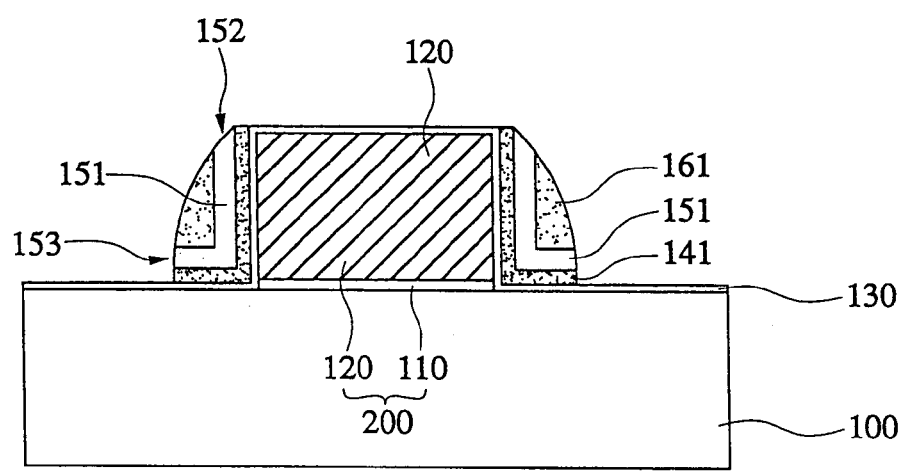

Next, as shown in FIG. 3C, the sacrificial layer 160, the spacer insulating layer 150 and the support layer 140 are anisotropically (dry) etched until the buffer insulating layer 130 is exposed. As a result, L-shaped support patterns 141 are formed over the side walls of the gate pattern 200 and respective portions of the semiconductor substrate 100 adjacent to the gate pattern 200, L-shaped spacers 151 are formed over the support patterns 141, and sacrificial patterns 161 are formed over the L-shaped spacers 151.

The sacrificial patterns 161, the L-shaped spacers 151, and the L-shaped support patterns 141 can be formed in the same dry etching process. For example, the dry etching process includes a main etching stage and an over-etch stage using $CF_4$ and $O_2$ gas. The main etching is performed in an etching chamber to which a power of 180 W to 220 W is supplied, and at a pressure of 90 mTorr to 110 mTorr. The over-etching is performed at a power of 90 W to 110 W, and at a pressure of 135 mTorr to 165 mTorr. As a result, the interval between the vertical portions 152 of the L-shaped spacers 151 and the gate pattern 200, and the interval between the lateral portions 153 and the buffer insulating layer 130, correspond to the thickness of the L-shaped support patterns 141.

Figure 3D:
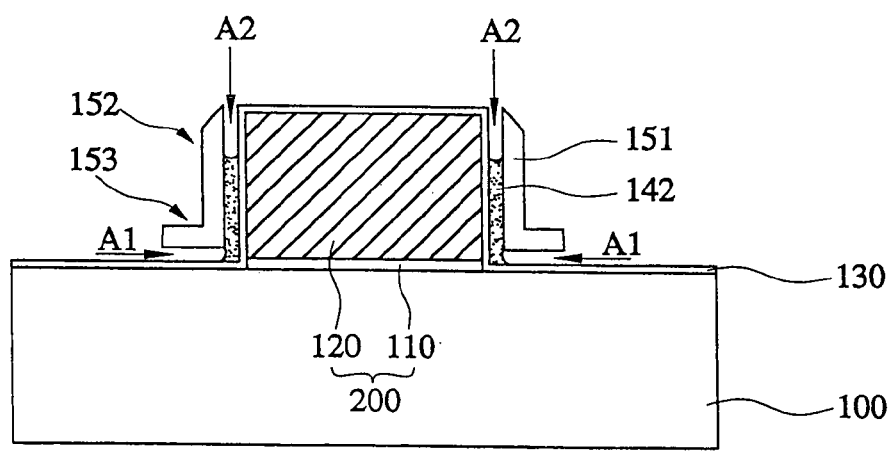

Then, as shown in FIG. 3D, the L-shaped spacers 151 are exposed by removing the sacrificial patterns 161. A wet etch process is performed to remove at least some of the L-shaped support patterns 141. The wet etch process is carried out, though, to leave those parts of the L-shaped support patterns 141 covered by the vertical portions 152 of the L-shaped spacers 151, respectively. Accordingly, support portions 142 are formed between the L-shaped spacers 151 and that portion of the buffer insulating layer 130 which covers the side walls of the gate electrode 120. The support portions define air gaps A1 between the lateral portions 153 of the L-shaped spacers 151 and the buffer insulating layer 130 and/or the substrate 100. The support portions 142 are configured in accordance with the etch rate or the etch time of the wet etch process. In the meantime, air gaps A2 can be formed by the wet etch process between the vertical portions 152 of the L-shaped spacers 151 and that portion of the buffer insulating layer 130 which covers the side walls of the gate electrode 120.

In the case in which the support layer 140 is a polysilicon layer, the wet etch process is performed using a $NH_3OH$ solution at a temperature of 45° C. to 55° C. In the case in which the support layer 140 is a nitride layer, the wet etch process is performed using a $H_3PO_4$ solution at a temperature of 145° C. to 150° C.

On the other hand, the sacrificial patterns 161 can be removed by a dry etch or a wet etch process. In the case in which the sacrificial patterns 161 and the L-shaped support patterns 141 are formed of the same material, the removal of the sacrificial patterns 161 and the formation of the support portions 142 can be performed at the same time. That is, the sacrificial pattern 161 can be removed during the etching of the support patterns 141.

Figure 3E:
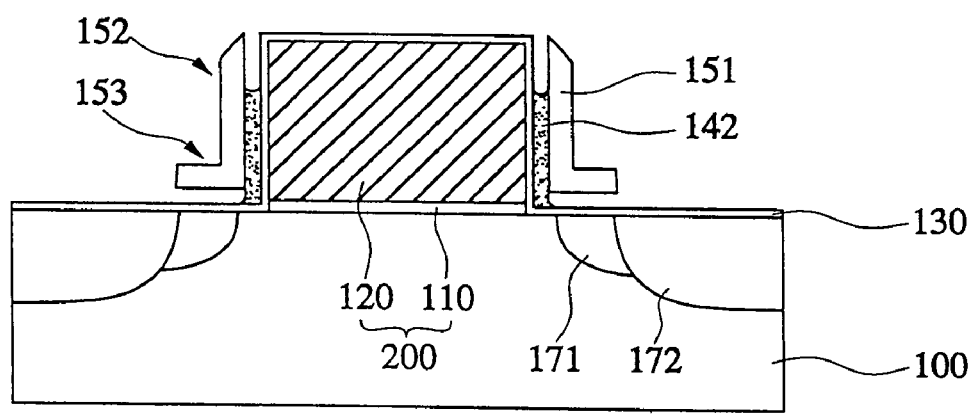

Then, as shown in FIG. 3E, an ion implantation process and a thermal treatment process are carried out to form source/drain regions in the semiconductor substrate 100 adjacent to (the opposite sides) of the gate pattern 200. More specifically, a relatively small concentration of ions is implanted into the substrate 100, using the gate pattern 200 and the L-shaped spacers 151 as ion-implantation masks, to form lightly-doped source/drain regions 171 in regions of the semiconductor substrate 100 located beneath the lateral portions 153 of the L-shaped spacers 151. Also, a relatively large concentration of ions is implanted in regions of the semiconductor substrate 100 adjacent the ends of the lateral portions 153 of the L-shaped spacers 151, respectively, i.e., in regions not covered by the ion-implantation masks, to form highly-doped source/drain regions 172.

According to the present invention, as described above, parasitic capacitance around the gate electrode can be minimized by forming an air gap having a relatively low permittivity between the semiconductor substrate and the lateral portions of the L-shaped spacers that are formed on the side walls of the gate electrode so as to serve as am ion implantation mask during the forming of the source/drain regions.

Finally, although the present invention has been described above in connection with the preferred embodiments thereof, the present invention is not so limited. For example, a buffer insulating layer has been disclosed as being formed on the gate pattern and the surface of the semiconductor substrate to compensate for etching damage. The buffer insulating layer can also serve to protect the gate electrode when the support layer does not have an etch selectivity with respect to the material of the gate electrode, such as when the support layer and the gate electrode are formed of the same material. However, the buffer insulating layer can be omitted in the case in which the support layer has a sufficient etch selectivity with respect to the gate electrode. Therefore, various changes and modifications can be made to the preferred embodiments without departing from the true spirit and scope of the invention as defined by the appended claims.

What is claimed is:

1. A semiconductor device comprising:
   a semiconductor substrate having source/drain regions spaced from each other;
   a gate pattern disposed on the semiconductor substrate between the source/drain regions, said gate pattern having opposite side walls;
   L-shaped spacers each including a vertical portion covering a respective one of the side walls of the gate pattern, and a lateral portion extending laterally from the bottom of the vertical portion over a respective one of the source/drain regions, whereby the bottom surface of each L-shaped spacer at the underside of the lateral portion faces the substrate; and
   support portions interposed between said L-shaped spacers and the gate pattern, said support portions supporting said L-shaped spacers such that the lateral portion of each of the L-shaped spacers is spaced above the source/drain region over which the L-shaped spacer extends, and wherein an air gap exists between the lateral portion of each of the L-shaped spacers and the source/drain region over which the lateral portion extends, the entire bottom surface of the L-shaped spacer being exposed and delimiting the air gap.

2. The semiconductor device according to claim 1, wherein the source/drain region comprises a lightly-doped source/drain region over which the lateral portion of one of said L-shaped spacers extends, and highly-doped source/drain region disposed laterally of the lateral portion of the L-shaped spacer.

3. The semiconductor device according to claim 1, wherein said L-shaped spacers comprise an oxide layer.

4. The semiconductor device according to claim 1, wherein said support portions comprise a polysilicon layer or a nitride layer.

5. The semiconductor device according to claim 1, and further comprising a buffer insulating layer interposed between said gate pattern and said support portions.

6. A semiconductor device comprising:
   a semiconductor substrate having source/drain regions spaced from each other;
   a gate pattern disposed on the semiconductor substrate between the source/drain regions, said gate pattern having opposite side walls;
   L-shaped spacers each including a vertical portion covering a respective one of the side walls of the gate pattern, and a lateral portion extending laterally from the bottom of the vertical portion over a respective one of the source/drain regions; and
   support portions interposed between said L-shaped spacers and the gate pattern, said support portions supporting said L-shaped spacers such that the lateral portion of each of the L-shaped spacers is spaced above the source/drain region over which the L-shaped spacer extends, and wherein an air gap exists between the lateral portion of each of the L-shaped spacers and the source/drain region over which the lateral portion extends, and
   wherein the source/drain regions include lightly-doped source drain regions, respectively, and the gate pattern and said support portions are disposed over a region of the substrate confined between the lightly-doped source/drain regions.

7. The semiconductor device according to claim 6, wherein said source/drain regions include highly-doped source/drain regions disposed laterally of the lateral portions of the L-shaped spacers, respectively.

8. The semiconductor device according to claim 6, wherein said L-shaped spacers comprise an oxide layer.

9. The semiconductor device according to claim 6, wherein said support portions comprise a polysilicon layer or a nitride layer.

10. The semiconductor device according to claim 1, and further comprising a buffer insulating layer interposed between said gate pattern and said support portions.

* * * * *